(12) United States Patent
Edwards et al.

(10) Patent No.: US 9,322,870 B2
(45) Date of Patent: Apr. 26, 2016

(54) WAFER-LEVEL GATE STRESS TESTING

(71) Applicants: William E. Edwards, Ann Arbor, MI (US); Randall C. Gray, Tempe, AZ (US); Christopher B. Lesher, Gilbert, AZ (US)

(72) Inventors: William E. Edwards, Ann Arbor, MI (US); Randall C. Gray, Tempe, AZ (US); Christopher B. Lesher, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 179 days.

(21) Appl. No.: 14/016,957

(22) Filed: Sep. 3, 2013

(65) Prior Publication Data
US 2015/0067429 A1 Mar. 5, 2015

(51) Int. Cl.
*G01R 31/28* (2006.01)

(52) U.S. Cl.
CPC .................................. *G01R 31/2818* (2013.01)

(58) Field of Classification Search
CPC ............. G01R 31/2884; G01R 31/024; G01R 13/208; G01R 31/006; G01R 31/2818
USPC .............. 257/48; 324/754, 758; 714/726, 734
See application file for complete search history.

(56) References Cited

U.S. PATENT DOCUMENTS

| 5,798,281 | A | 8/1998 | Smayling | |
|---|---|---|---|---|
| 5,905,383 | A * | 5/1999 | Frisch | 324/756.05 |
| 6,348,806 | B1 | 2/2002 | Okandan et al. | |
| 7,650,545 | B1 * | 1/2010 | Abramovici et al. | 714/726 |
| 2004/0188678 | A1 * | 9/2004 | Wieczorek et al. | 257/48 |
| 2007/0111340 | A1 * | 5/2007 | Goldberger | H01L 22/14 438/17 |
| 2008/0061808 | A1 * | 3/2008 | Mok et al. | 324/758 |
| 2009/0160466 | A1 * | 6/2009 | Liu | 324/754 |
| 2010/0216290 | A1 * | 8/2010 | Lin | H01L 29/4236 438/270 |
| 2010/0327893 | A1 * | 12/2010 | Vilas Boas et al. | 324/754.07 |
| 2014/0361804 | A1 * | 12/2014 | Wang et al. | 324/756.03 |
| 2015/0037948 | A1 * | 2/2015 | Li | H01L 29/66825 438/257 |

OTHER PUBLICATIONS

Ballouli et al., "Known Good Die Achieved Through Wafer Level Burn-In and Test", Int'l Electronics Manufacturing Technology Symposium, 2000, pp. 153-159.

* cited by examiner

*Primary Examiner* — David Ton
(74) *Attorney, Agent, or Firm* — Lempia Summerfield Katz LLC

(57) ABSTRACT

A method of testing a semiconductor device includes forming a test circuit over a semiconductor substrate. The test circuit includes a plurality of interconnects electrically connected to a set of device structures supported by the semiconductor substrate. A test, such as a gate stress or leakage current test, of each device structure is conducted with the test circuit. The plurality of interconnects are removed after conducting the test.

19 Claims, 5 Drawing Sheets

WAFER-LEVEL GATE STRESS TESTING

FIELD OF INVENTION

The present embodiments relate to semiconductor devices.

BACKGROUND

Flaws in the oxide layer of a field effect transistor (FET) device present one of the most important reliability problems for an integrated circuit (IC). Point defects can develop during oxidation processes. Defects may take the form of particulate impurities or pinholes. If the defects are large enough, shorts are created between a gate layer and substrate. Flaws can also present problems in the absence of a short. The local breakdown voltage for the oxide layer in the vicinity of a defect can be considerably lower than the theoretical breakdown voltage for the oxide material. For example, a defect having a size of about half of the oxide thickness may reduce the breakdown voltage by about 50%.

To screen out gate oxide defects, IC manufacturers perform gate stress and burn-in procedures to improve IC reliability. During a typical gate stress procedure, a voltage in excess of the normal operating voltage but less than the maximum rated voltage is applied to the gates of the FET devices in an IC. Gate current leakage is measured before and after the stress. Detection of increases in gate leakage, parametric circuit shifts, or ruptured gate oxide layers are indicative of defects, and used to reject devices as failures.

Gate stress procedures are often incompatible with ICs. In single thickness gate oxide ICs, such as a microprocessor, gate stress is often applied to all devices by elevating the supply voltage. But this technique is not effective for mixed-signal and power ICs with multiple thickness gate oxides (e.g. dual dielectric) with both logic and power devices present on the IC. Different voltage values are used to gate stress low voltage logic transistors and power transistors. In other types of circuits, such as analog circuits, the nature of the analog circuit topology may prevent all components from being gate stressed.

Burn-in procedures are expensive and do not always screen out gate oxide defects. Implementing a burn-in procedure often takes an undesirably long period of time. The burn-in procedure also typically involves costly equipment. A considerable amount of manufacturing floor space is devoted to the equipment. Burn-in costs often amount to a significant component of the overall total cost of an IC product.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
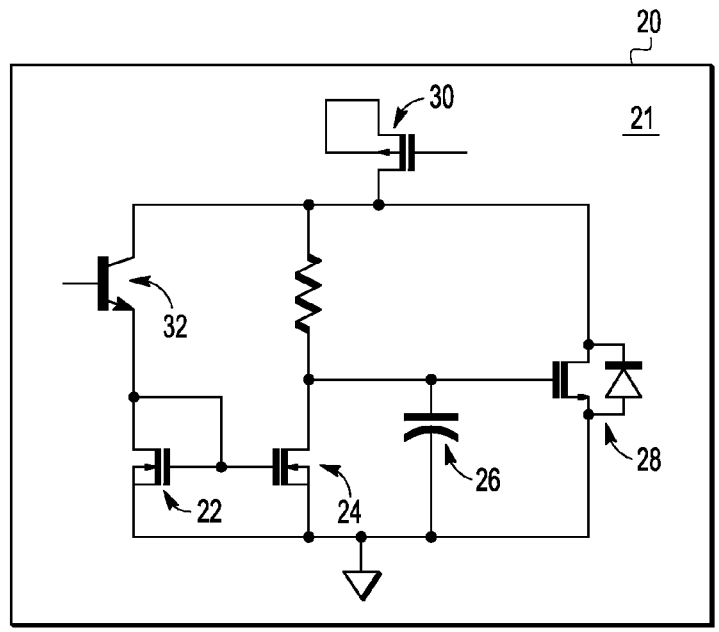
FIG. 1 is a partial circuit diagram of an IC apparatus or semiconductor device having a number of transistor and other devices with gate structures to be stressed and tested for defects.

Methods of fabricating, gate stressing, and testing semiconductor devices are described. The testing may be directed to detecting gate oxide defects. The semiconductor devices are tested inline, or during fabrication, in contrast to typical post-fabrication testing. A number of sacrificial interconnects are used to implement the testing at a wafer or other level before continuing with the fabrication process flow. The testing may include or involve the measurement of leakage current, as in gate stress testing, for a given transistor or other component, or group of transistors or components. The sacrificial nature of the interconnects allows a test circuit to be configured and tailored to gate stress any number of devices, including field-effect transistor (FET) devices, capacitors, and other devices having gate oxides of different thicknesses. The disclosed embodiments may thus be useful in connection with testing dual and other multiple dielectric semiconductor devices. For example, thick and thin oxides of a semiconductor device may be individually and optimally stressed.

The sacrificial interconnects of the disclosed embodiments may be arranged in a test circuit topology customized for the testing (e.g., gate stress testing). The sacrificial interconnects provide customized connections to support unlimited gate stress testing. The testing thus need not be limited to logic cores, power field effect transistor (FET) devices, or large capacitors, as in past gate stress testing. The test circuits and methods of the disclosed embodiments provide a technique for applying gate stress to all of the gate oxides in an integrated circuit (IC) product, including those that cannot be stressed using the interconnects of the IC product, such as the gate oxides in a current mirror, a diode connected FET, or other embedded device arrangements. The disclosed embodiments may thus support a leakage current test and measurement methodology more comprehensive than the tests and measurements available at the final probe stage or package level. Zero defect screening for gate oxide defects may thus be achieved. The disclosed embodiments may alternatively or additionally be used to reduce the amount of circuitry and wafer area devoted to built-in self testing (BIST).

The testing may be implemented with an interconnect system and a set of probe pads to simultaneously test all devices on a wafer. The simultaneous testing may be implemented in parallel. The test circuits may include a row and column or other interconnect scheme that crosses die boundaries or otherwise minimizes prober index time. Although useful for testing at the wafer level, the disclosed embodiments are scalable for testing at various levels of specificity. The test circuit may be configured for testing on a gate-by-gate basis, a circuit-by-circuit basis, or at a reticle or wafer quadrant level.

The inline nature of the testing provides information that may be useful in multiple ways. A wafer map of current leakage information may be fed forward in the fabrication flow to reduce final probe time. Such information may also be beneficially fed backward in an effort to diagnose yield problems. The disclosed embodiments may provide early detection of fabrication issues.

Interconnects and probe pads of the test circuit may be formed using a metal layer deposited for contact plugs. Once the testing is completed, the interconnects and probe pads are removed, while the contact plugs remain for coupling the metallization of the IC product to the device structures. A number of probe pads may be provided at the die, reticle, or wafer level. For example, probe pads may be provided to accommodate multiple oxide thicknesses (e.g., a low voltage stress and a high voltage stress for thin and thick oxides, respectively), as well as for drain/source and other device structure connections. One or more substrate or well connections may be provided for electrical isolation.

The disclosed embodiments may use cross-under connectors to allow the interconnect networks of the test circuit to be achieved in a single metal layer. The cross-under connectors may be established at the polysilicon or gate level and/or in doped regions of the substrate. The test circuit may also include doped regions of the substrate to form resistors used for device isolation or current limiting as described below.

The interconnects of the disclosed embodiments may include test validation lines in addition to the lines configured to apply the stress voltages and conduct the leakage measurements. Any number of test validation lines may be included to verify that gates were subjected to the stress and leakage testing. The interconnects applying the stress and measurement voltages may be disposed in a serpentine arrangement in which an interconnect winds from component to component to connect multiple components in parallel.

Although described below in connection with gate oxide stress testing, the disclosed embodiments may be useful in connection with other gate-related test procedures (e.g., testing relating to gate structures or gate-like structures in, for instance, capacitors and other components), such as leakage current test procedures. For example, the disclosed embodiments may be applied to implement Idd quiescent (Iddq) testing. Other present or hereafter developed leakage current test procedures may be implemented using the disclosed embodiments. The disclosed embodiments may also be useful with other test procedures (e.g., test procedures not directed to detecting defects in gate structure).

FIG. 1 is a schematic view of a circuit 20 on a semiconductor wafer 21 having a number of component devices that are unreachable during traditional stress tests, but may be tested using the disclosed embodiments. The circuit 20 is configured such that some constituent or component devices are embedded in arrangements that would render post-fabrication gate stress and other current leakage testing impossible. In this example, the circuit 20 includes an re-channel logic metal-oxide-semiconductor (MOS) FET device 22 connected as a diode with another n-channel logic MOSFET device 24 in a current mirror arrangement. Once the metallization of the circuit 20 is complete, the gate and drain terminals of the MOSFET device 22 would be electrically connected as shown. The MOSFET device 22 would thus no longer be available for a gate stress test.

The circuit 20 includes further examples of embedded devices not available for testing. A capacitor 26 and an n-channel power MOSFET transistor device 28 are driven by the voltage at a source terminal of a p-channel power MOSFET device 30. The oxides of the capacitor 26 and the n-channel power MOSFET device 28 would thus also be unreachable during a traditional stress test.

In the example of FIG. 1, only the p-channel MOSFET device 30 of the circuit 20 would be testable without introducing interconnects (not shown) dedicated to such testing. While such interconnects could support partial or incremental testing of the device structures of the circuit 20, the presence of a bipolar junction transistor (BJT) device 32 would further limit such efforts.

Such incremental testing of the circuit 20 may be further hampered if the device structures have different oxide thicknesses. In the example of FIG. 1, the capacitor 26 may have a different oxide layer thickness than the power MOSFET device 28. For example, the capacitor 26 may have a thin oxide layer, while the power MOSFET device 28 may have a thick oxide layer. In some cases, a thin oxide layer may have a thickness less than about 100 Å, such as about 50 Å. In such cases, a thick oxide layer may have a thickness greater than about 100 Å, such as about 300 Å. The oxide thicknesses or thickness ranges may vary.

With the gates (or gate-like electrode) of the capacitor 26 and the transistor device 28 tied to one another, only the thin oxide can be stressed and tested. Application of a voltage appropriate for stressing the thin oxide of the capacitor 26 may be inadequate for the thick oxide of the MOSFET device 28. Application of a voltage sufficiently high to stress the thick oxide of the MOSFET device 28 may damage the capacitor 26.

Figure 2:
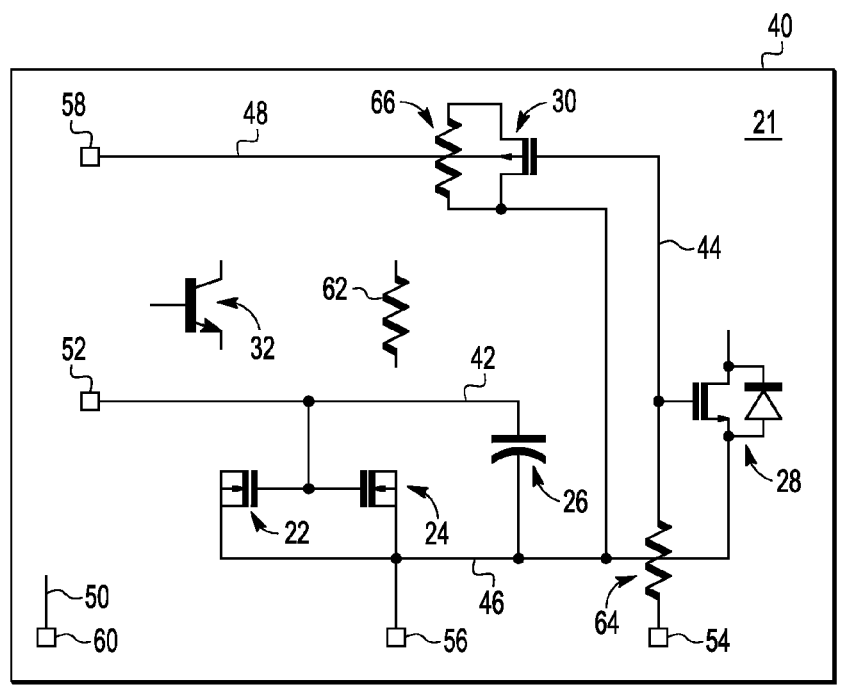
FIG. 2 is a partial circuit diagram of a test circuit for the semiconductor device of FIG. 1 having a number of sacrificial interconnects and probe pads in accordance with one embodiment.

FIG. 2 depicts a circuit schematic view of the wafer 21 during fabrication of the circuit 20 of FIG. 1. At this point during fabrication, the metallization of the circuit connections shown in FIG. 1 has yet to occur. Instead, a test circuit 40 is formed over the wafer 21 for inline testing of the component devices of the circuit 20 (FIG. 1). The test circuit 40 is deposited over, and supported by, a semiconductor substrate of the wafer 21 as described herein (see, e.g., the cross-sectional views of FIGS. 3 and 4).

The test circuit 40 includes a plurality of sacrificial interconnects to provide access to the gate structures of the devices for gate stress and/or other current leakage testing. In this example, the interconnects include a low voltage interconnect network 42, a high voltage interconnect network 44, a source/drain interconnect network 46, an isolation interconnect network 48, and a substrate isolation interconnect network 50. The low voltage interconnect network 42 may be used for testing transistor or other devices with thin oxide layers, while the high voltage interconnect network 44 may be used for testing devices with thick oxide layers.

The test circuit 40 further includes a respective probe pad for each network. The probe pads are electrically connected to the regions and structures of the devices to be tested through the respective interconnect networks. Each type of region or structure is connected in parallel via the respective network. In this example, a probe pad 52 is electrically connected via the network 42 to gate structures of the low voltage or thin oxide devices, such as the n-channel logic MOSFET devices 22, 24 and the capacitor 26. A probe pad 54 is electrically connected via the network 44 to gate structures of the high voltage or thick oxide devices, such as the n-channel power MOSFET device 28 and the p-channel power MOS- FET device 30. A probe pad 56 is electrically connected via the network 46 to device regions, such as source/drain and body regions, of the logic and power transistor devices.

The transistor devices may be isolated during testing through bias voltages applied via the networks 48 and 50. In this example, isolation well regions of the transistor devices (e.g., the isolation well region of the p-channel power MOSFET device 30) may be biased by a voltage applied to a probe pad 58 electrically connected with the network 48. A probe pad 60 is electrically connected via the network 50 to bias the substrate of the wafer 21.

The sacrificial interconnect networks of the test circuit 40 are disposed in a circuit topology directed to applying the gate stress and/or other test voltages to the device structures of the circuit 20 (FIG. 1). The circuit topology may thus disregard or bypass components without oxide layers to be stressed or tested, such as the BJT device 32 and a resistor 62.

The sacrificial interconnect networks of the test circuit 40 may include a number of cross-under connectors to allow the circuit topology to include crossing lines. In this example, the test circuit 40 includes a cross-under connector 64 in the high voltage network 44 and a cross-under connector 66 in the source/drain network 46. The connectors 64 and 66 are depicted as resistors in the schematic view of FIG. 2, insofar as each connector may be implemented via either a polysilicon connector or a doped substrate connector. The polysilicon connectors may be formed during a gate deposition and patterning procedure. The doped substrate connectors may be formed during a source/drain or other dopant implantation procedure. Further details regarding such procedures are provided below.

Figure 3:
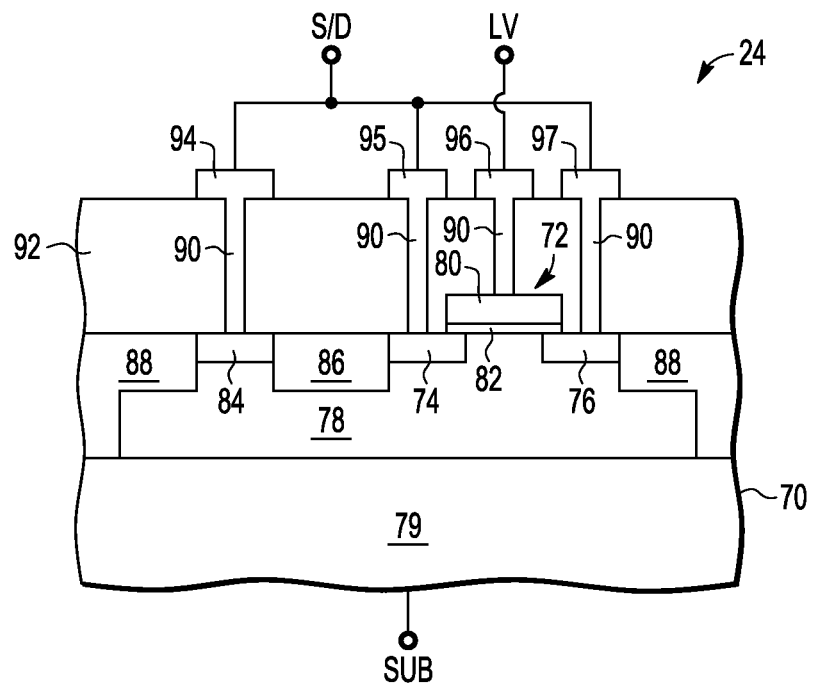
FIG. 3 is a schematic, simplified, cross-sectional view of a semiconductor device during fabrication with sacrificial interconnects of a test circuit in accordance with one embodiment.

FIG. 3 is a cross-section of the n-channel logic MOSFET device 24. The device 24 includes a number of device regions disposed in a semiconductor substrate 70 and a gate structure 72 supported by the semiconductor substrate 70. The device regions include source and drain regions 74, 76 disposed at ends of the gate structure 72, and a body 78 in which a channel is formed between the source and drain regions 74, 76 during operation. In this example, the body 78 corresponds with an epitaxial layer of the substrate 70 grown on a base substrate 79, such as a bulk silicon substrate. Alternatively or additionally, the body 78 is a doped well formed in the epitaxial layer or other portion of the substrate 70. The gate structure 72 includes a polysilicon layer 80 and an oxide layer 82 between the polysilicon layer 80 and the substrate 70. The device 24 also includes a body contact region 84 separated from the source region 74 by a shallow trench isolation (STI) region 86. Further STI regions 88 isolate the device 24 along its periphery. The configuration and other characteristics of the device 24 may vary considerably from the example shown. For example, the device 24 may include a doped device isolating ring, tub, or other region in addition to STI and/or deep trench isolation (DTI) regions.

The device 24 includes a number of contact plugs 90 to establish electrical connections with the regions and structures formed in and over the substrate 70. The contact plugs 90 are disposed in openings in a dielectric layer 92 deposited over the substrate 70. The dielectric layer 92 may include a stack of materials patterned to define the contact openings. The contact plugs 90 may include multiple metal materials or layers, including, for instance, an Ohmic metal layer, a transition layer, and a conduction layer.

Sacrificial interconnects 94-97 may be deposited or otherwise formed to implement the gate stress or other testing. For example, the sacrificial interconnects 94-97 may be deposited on the dielectric layer 92 or formed in the plug metallization. The sacrificial interconnect 94 is disposed to electrically connect to the contact plug 90 for the base region 78. The sacrificial interconnect 95 is disposed to electrically connect to the contact plug 90 for the source region 74. The sacrificial interconnect 96 is disposed to electrically connect to the contact plug 90 for the gate structure 72. The sacrificial interconnect 97 is disposed to electrically connect to the contact 90 for the drain region 76.

The sacrificial interconnects 94-97 may be configured to implement the connections of the test circuit shown in FIG. 2. In this example, the sacrificial interconnects 94, 95, and 97 are connected to the source/drain contact pad 56 (FIG. 2) to bias and measure leakage current at the source, drain, and body regions 74, 76, and 78 for the gate stress testing. The sacrificial interconnect 96 is connected to the low voltage gate contact pad 52 (FIG. 2) to apply the gate stress voltage and bias the gate structure 72 for leakage current measurements. The gate stress voltage may be applied across the two terminals separated by a dielectric layer. For a FET device, the voltage may be applied across the gate and source/drain terminals via the above-referenced pads and interconnects. For other devices, such as capacitors, the voltage may be applied across the plates or other conductive structures separated by the dielectric layer. The plates or other conductive structures of a capacitor may be provided, for instance, by a polysilicon structure and a doped substrate region, by a pair of polysilicon structures, by a polysilicon structure and a metal structure, or by a pair of metal structures. In this embodiment, the substrate 70 is biased with a backside contact. Alternatively or additionally, the substrate bias may be established with a contact plug disposed outside of the active area of the device 24, such as outside of a device isolation ring.

The sacrificial interconnects 94-97 are removed upon completion of the gate stress testing. For example, the sacrificial interconnects 94-97 may be removed through etching (e.g., a chemical, plasma, or other etching procedure), a chemical-mechanical planarization (CMP) or other planarization procedure. The sacrificial interconnects 94-97 are thus temporary structures that are removed to allow further metallization of the device 28 to form interconnects of the circuit. The planarization procedure exposes upper ends of the contact plugs 90 as shown so that metallization of the device 28 may be implemented to form the circuit connections shown in FIG. 1.

The cross-under connectors of the test circuits may include similar contact plugs. For example, two contact plugs may be provided to electrically connect to a polysilicon cross-under connector. The polysilicon cross-under contact may be configured similarly to the gate structure 72, but disposed in an area not having source and drain regions or other transistor device structures. Contact plugs may also be provided to reach a cross-under connector disposed in the substrate 70 in an active area other than that of the n-channel logic MOSFET 24. The substrate cross-under connector may be configured similarly to one of the source and drain regions 74, 76, but disposed in an area not having a gate structure or other transistor device structures.

Figure 4:
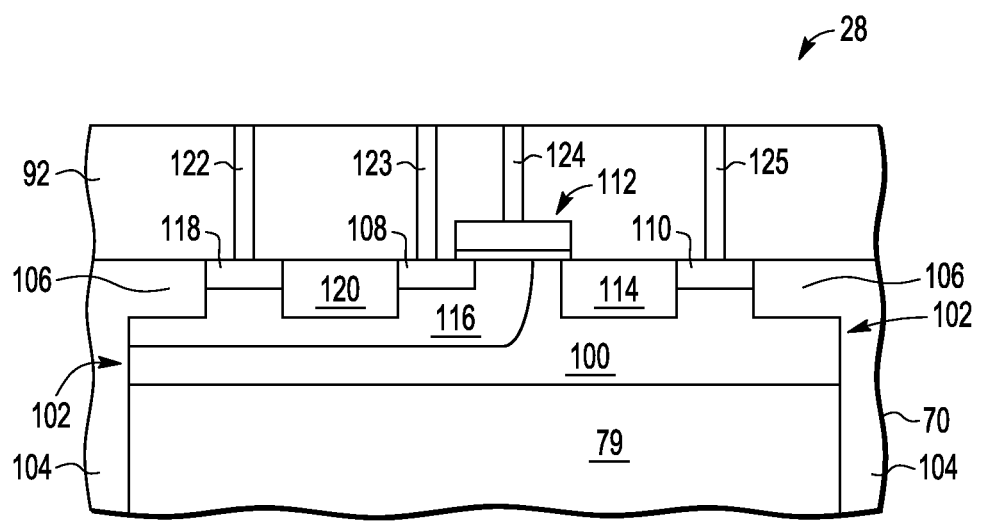
FIG. 4 is a schematic, simplified, cross-sectional view of another semiconductor device during fabrication after removal of sacrificial interconnects of a test circuit in accordance with one embodiment.

FIG. 4 is a cross-section of the n-channel power MOSFET device 28 after completion of the stress testing and removal of the interconnects. In this example, the device 28 is configured as a laterally diffused MOS (LDMOS) transistor device. The device 28 may be formed in an epitaxial layer 100 of the semiconductor substrate 70. The epitaxial layer 100 is grown on the base substrate 79. The device 28 includes a number of device regions disposed in the epitaxial layer 100 within an isolation ring 102. In this example, the isolation ring 102 includes a ring-shaped deep trench isolation (DTI) ring 104. The device 28 may be further isolated at the surface of the semiconductor substrate 70 by a ring-shaped shallow trench isolation (STI) region 106. The configuration of the isolation ring 102 may differ from the example shown. For example, the isolation ring 102 may include one or more doped isolating regions along the lateral periphery of the device 28 established by the DTI ring 104. Alternatively or additionally, the isolation ring 102 may be part of an isolation tub that further includes a buried isolation layer that extends under and across the lateral extent of the active area of the device 28.

The device 28 includes source and drain regions 108, 110 and a gate structure 112 supported at the surface of the substrate 70 between the source and drain regions 108, 110. The drain region 108 may be laterally spaced from the gate structure 112 as shown. In this example, an STI region 114 is disposed between the drain region 110 and the gate structure 112. The source region 108 is disposed within or on a body region 116 in which a channel is formed under the gate structure 112 during operation. The body region 116 is biased by a body contact region 118. The body contact region 118 may be laterally spaced from the source region 108 by an STI region 120.

The configuration of the device 28 may vary from the example shown. For example, the device 28 may be configured as an active drift device rather than a field drift LDMOS device. The disclosed embodiments may be used with other power MOSFET or other transistor configurations. The disclosed embodiments may, in fact, be useful with circuits having multiple transistor configurations to the extent that the configurations call for different gate stress or other testing.

Contact plugs 122-125 are provided in openings in the dielectric layer 92 for electrical connectivity to the gate structure 112 and device regions of the device 28. Gate stress and other voltages may thus be applied via the sacrificial interconnects to the structures and regions to implement the test procedures. In this example, the contact plug 122 is electrically connected to the body contact 118 to bias the body region 116 during the stress testing and/or measure leakage current. The contact plug 123 is electrically connected to the source region 108 to measure leakage current. The contact plug 124 is electrically connected to the gate structure 112 to apply the gate stress voltage. The contact plug 125 is electrically connected to the drain region 110 to measure leakage current.

The sacrificial interconnects to provide the voltages to the contact plugs 122-125 during gate stress testing are not shown in FIG. 4. The sacrificial interconnects are removed after completion of the gate stress or other testing. As described below, a planarization procedure may be implemented to expose upper ends of the contact plugs 122-125 for further metallization in accordance with the circuit connections shown in FIG. 1.

A number of characteristics of the above-described embodiments may vary. For instance, the disclosed embodiments are not limited to a particular substrate type or configuration. A variety of semiconductor materials may be used, including elementary semiconductors, such as silicon (Si), and compound semiconductors, such as GaAs. Other compound and non-compound semiconductor materials may be used. The substrate 70 may be a bulk semiconductor wafer. Other types of semiconductor substrates may be used. For example, the substrate 70 may be configured as a semiconductor-on-insulator (SOI) substrate. In some cases, the substrate 70 is a composite substrate with any number of layers (e.g., epitaxial layers). For example, the substrate 70 may include an original p-type semiconductor substrate on which the insulator, epitaxial, or other layers are grown or otherwise formed. Alternatively or additionally, the substrate 70 includes non-semiconductor materials. The disclosed embodiments are not limited to any particular technology or technology node.

Figure 5:
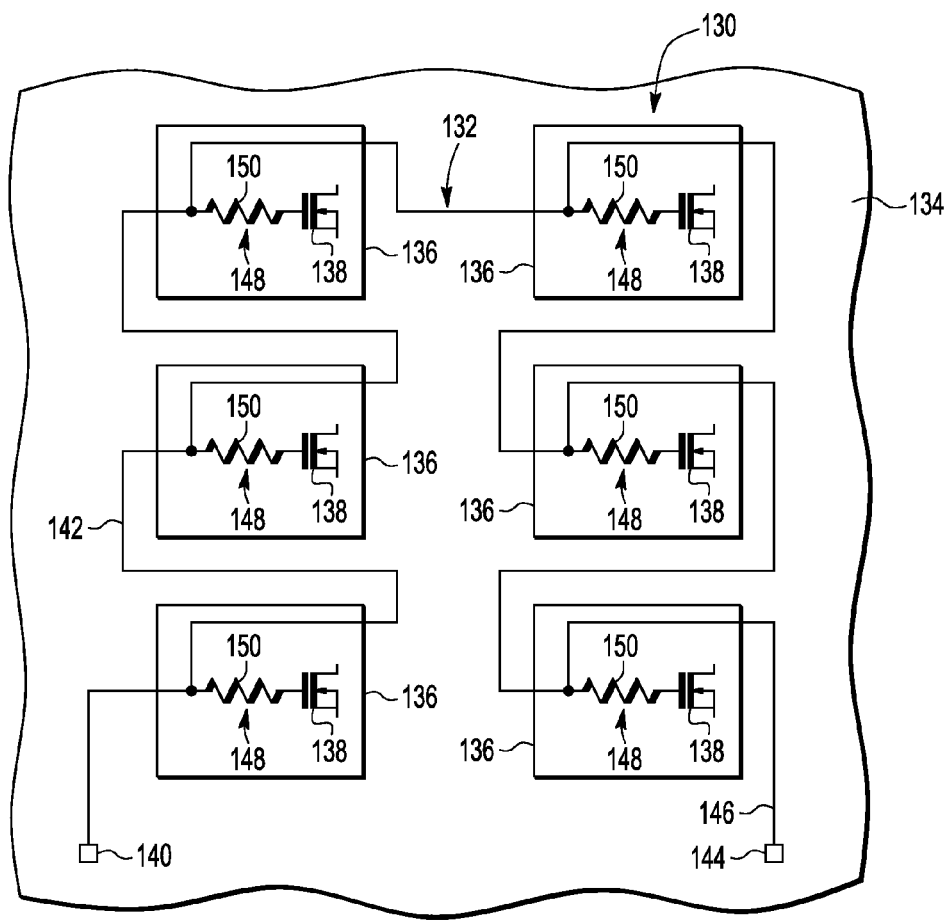
FIG. 5 is a partial circuit diagram of a semiconductor wafer with a set of semiconductor device die and a test circuit having a serpentine interconnect and a return interconnect in accordance with one embodiment.

FIG. 5 is a schematic view of a test circuit 130 having a network 132 of interconnects. The test circuit 130 is disposed on a wafer 134 or substrate on which semiconductor device structures are being fabricated for a number of die 136. Six of the die 136 are shown for ease in illustration. Any number of die 136 may be disposed on the wafer 134. Each die 136 is shown in simplified form with only a single MOSFET device 138 depicted. Each MOSFET device 138 includes device regions, such as source, drain, and body regions, formed or disposed in the wafer 134, and a gate structure supported by the wafer 134, as described above. The characteristics, arrangement, and other aspects of the semiconductor devices on each die 136 may vary considerably. Each die 136 may have any number and type of transistors or other components. Other components on each die 136 may be gate stressed or tested with the network 132 and/or another network.

The die 136 are indicated by boundary lines for ease in illustration. The boundary lines may, but need not, correspond with scribe lines for the die 136. The proximity of the boundary lines and, thus, the proximity of adjacent die, may vary from the example shown, insofar as, for instance, the test circuit 130 and the die 136 are not shown to scale.

The test circuit 130 includes a probe pad 140 for applying a bias voltage to the network 132 of interconnects. In this embodiment, the probe pad 140 is disposed outside of the boundaries of the die 136. Alternatively or additionally, each die 136 may include one or more probe pads within the die boundaries. The probe pad 140 is electrically connected to a serpentine interconnect 142 of the network 132. The serpentine interconnect 142 winds from die to die to electrically connect the gate structures of the MOSFET devices 138 to the probe pad 140. The test circuit 130 may include any number of probe pads to support the gate stress testing of the semiconductor devices on the die 136. For example, the test circuit 130 may include one or more probe pads for biasing source, drain, body, and/or other regions of the MOSFET devices 138 (and/or other transistors or components) disposed within the wafer 134. The probe pad(s) and corresponding network(s) for such biasing are not shown for ease in illustration. Additional probe pads may be included for separately testing or stressing devices on the die 136 other than the MOSFET devices 138. For example, an additional probe pad may be included for high voltage or power MOSFET devices on the die 136.

The test circuit 130 includes a probe pad 144 electrically connected to the gate structures of the MOSFET devices 138 by a return interconnect 146. The probe pad 144 and the return interconnect 146 are configured as a sense probe pad and a sense interconnect, respectively. The voltage at the probe pad 144 may be tested to confirm the integrity of the gate stress test. When a stress or other voltage is applied to the probe pad 140 to stress the gate structures of the MOSFET devices 138, the voltage at the probe pad 144 may be measured to confirm the integrity of the serpentine interconnect 142. If the voltage at the probe pad 144 equals or roughly equals the voltage applied to the probe pad 140, then there are no faults in the serpentine interconnect 142. The gate structure of each MOSFET device 138, or at least an interconnect leading thereto, is exposed to the voltage. Confirming the integrity of the test may be useful, insofar as it may otherwise be difficult to confirm that a stress or other voltage is reaching the gate structures from the leakage current data alone.

In the embodiment of FIG. 5, the serpentine interconnect 142 is indirectly connected to the gate structure of each MOS- FET device 138. A respective intermediary interconnect 148 electrically connects the serpentine interconnect 142 and the gate structure of each MOSFET device 138. In this example, each intermediary interconnect 148 includes a resistor 150. Each resistor 150 may act as an isolation resistor or current limiter. In the event of a failed gate oxide, the leakage current through the gate oxide is limited to a known level by the resistance presented by the resistor 150. In this way, the evaluation of the other oxides tested by the network 132 may continue despite the failure of one or more of the gate oxides. The resistor(s) 150 may be formed at the polysilicon level or with a doped region of the substrate.

Figure 6:
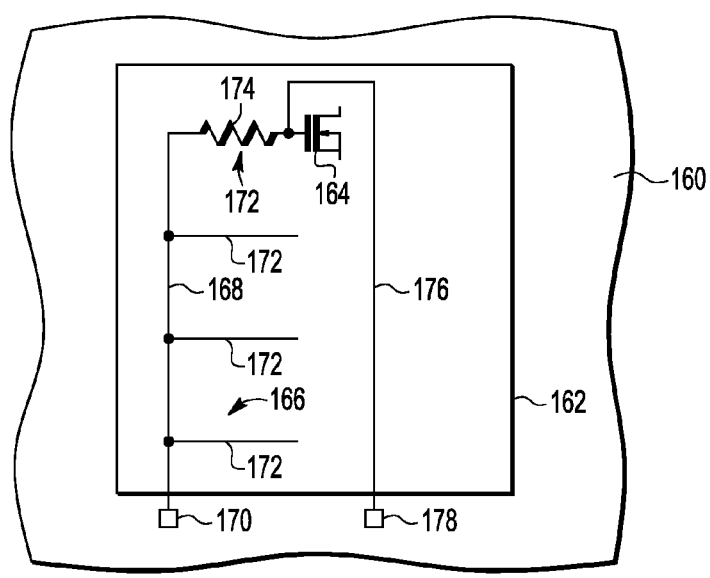
FIG. 6 is a schematic, partial circuit diagram of a semiconductor wafer with a semiconductor device die and a test circuit having a return interconnect dedicated to a transistor device in accordance with one embodiment.

The return interconnect 146 is also indirectly connected to the gate structure of the last MOSFET device 138 linked by the serpentine interconnect 142. In other embodiments, the serpentine interconnect 142 and/or the return interconnect are directly connected to a contact plug for the gate structure(s) of the MOSFET device(s) 138. An example of a direct connection is schematically shown in the example of FIG. 6.

As shown in FIG. 5, the serpentine interconnect 142 extends across the die boundary of each die 136. The return interconnect 146 may also extend across the die boundary. The extension across die boundaries is indicative of the manner in which the disclosed embodiments enable wafer level, reticle level, or other testing of multiple die. In alternative embodiments, the serpentine interconnect 142 and the return interconnect 146 are dedicated to a single die 136. The interconnects described herein need not extend across die boundaries. In such cases, the probe pads 140, 144 may be disposed within the boundaries of the single die 136.

The network 132 need not cover every die 136 on the wafer 134. For example, the number of die 136 tested by the network 132 may correspond with the wafer area covered in a photomask or reticle. In such cases, a set of probe pads may thus be provided for each reticle. A stepper may be used to access each set of probe pads respectively. In other cases, the network 132 may be configured to test a selected portion of a die, such as a perimeter area or quadrant.

The sacrificial nature of the network 132 and other sacrificial interconnect networks described herein provide the flexibility to customize the testing to a desired subset of the semiconductor devices on the wafer 134. The interconnect network may be configured to test at the device (or component) level, the die level, the reticle level, the wafer level, or other level.

FIG. 6 shows an example of testing at the die level. In this example, a wafer 160 includes a die 162 having a number of semiconductor devices, including a MOSFET device 164, to be tested. A network 166 includes an interconnect 168 to electrically connect a gate structure of the MOSFET device 164 and other devices to a probe pad 170. The interconnect 168 presents an alternative interconnect arrangement to the serpentine arrangement shown in FIG. 5. In this embodiment, the network 166 includes a number of interconnect segments 172 to connect the gate structures in parallel to the voltage at the probe pad 170. In some cases, the interconnect segment 172 includes an isolation resistor 174 as described above.

The embodiment of FIG. 6 also includes a return interconnect 176 to confirm the integrity of the interconnects providing the stress or other test voltages to the MOSFET device 164. In this embodiment, the return interconnect 176 is dedicated to a single device, the MOSFET device 164. The return interconnect 176 thus electrically connects the gate structure of the MOSFET device 164 to a probe pad 178. The MOSFET device 164 may be a device of particular interest on the die 162 for various reasons.

Figure 7:
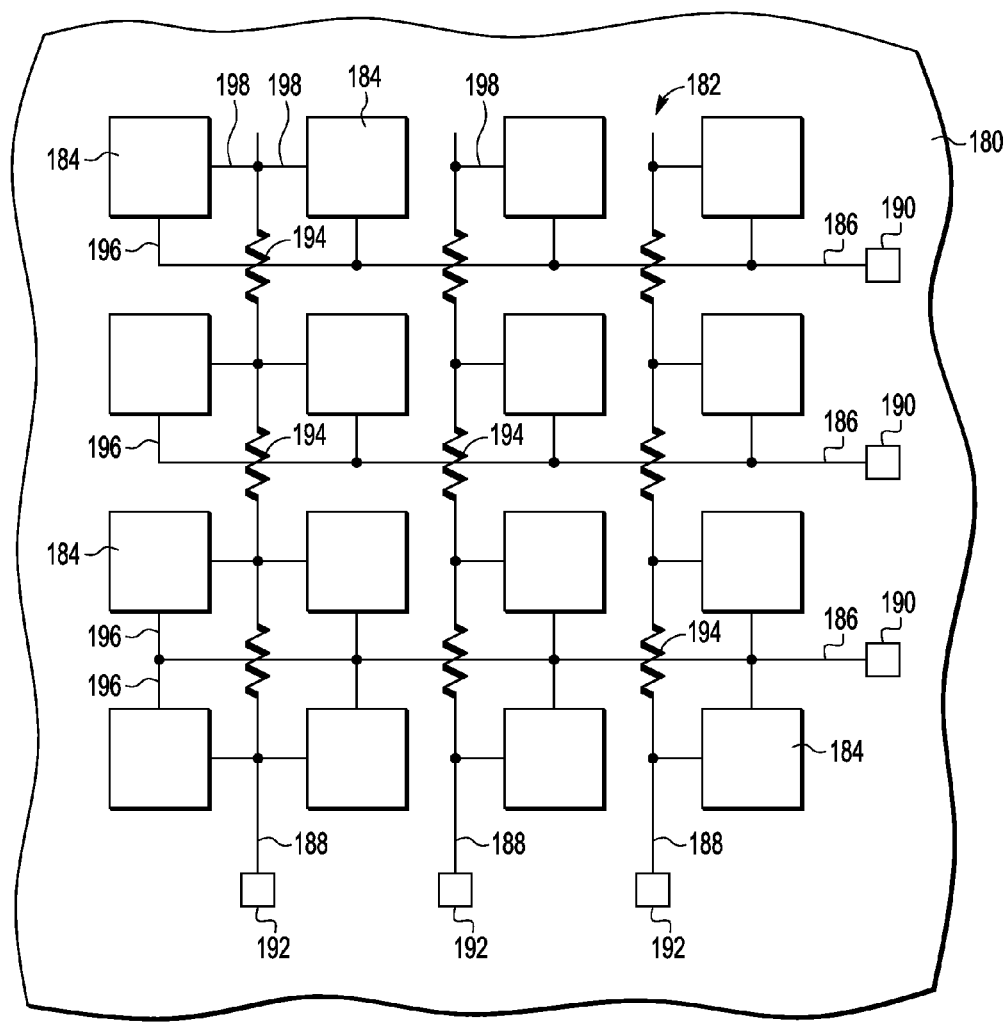
FIG. 7 is a plan, partial view of a semiconductor wafer and test circuitry having sacrificial interconnects and probe pads for a number of die of a wafer in accordance with one embodiment.

FIG. 7 shows an example of multiple die testing. In this example, a wafer 180 includes a test circuit 182 disposed in a grid arrangement for testing multiple die 184. The grid arrangement may be configured for testing a reticle or other section of die 184 on the wafer 180.

The test circuit 182 includes row interconnects 186 and column interconnects 188 for connecting probe pads 190, 192, respectively, to gate and/or other structures of devices on each die 184. In one example, the probe pads 190 are connected as described above to measure leakage current during a test of devices on each die 184 in a given row. Alternatively, the probe pads 190 are connected to provide a stress or other test voltage to gate or other device structures. The probe pads 192 may be used for biasing gate or other device structures, for measuring leakage current, or any other test function. In some embodiments, the interconnect networks connected to the probe pads 190 and/or the probe pads 192 may serve more than a single row or column of the die 184. For example, each probe pad 192 may be directed to biasing a different type of gate structure (e.g., low or high voltage) or device structure (e.g., source/drain, body, or substrate).

In this example, the column interconnects 188 include a number of cross-under connectors 194 at each crossing of the row interconnects 186 and the column interconnects 188. Each cross-under connector 194 may include a polysilicon connector or a doped substrate connector, as described above. Alternatively or additionally, one or more of the row interconnects 186 include cross-under connectors.

The row and column interconnects 186, 188 may include or connect to interconnect segments 196, 198, respectively, for respective connections to the die 184. The number, configuration, and placement of the interconnect segments 196, 198 may vary considerably from the example shown. For instance, the grid arrangement of the test circuit 182 need not be disposed between the die 184 as shown for ease in illustration. The row interconnects 186 and/or the column interconnects 188 may, but need not, be disposed along, on or near die scribe lines.

Further probe pads, interconnects, and cross-under connectors may be included in the test circuit 182. The test circuit 182 is shown in simplified form for ease in illustration. For example, not all of the connections between the respective die 184 and the row and column interconnects 186, 188 are shown for ease in illustration.

Figure 8:
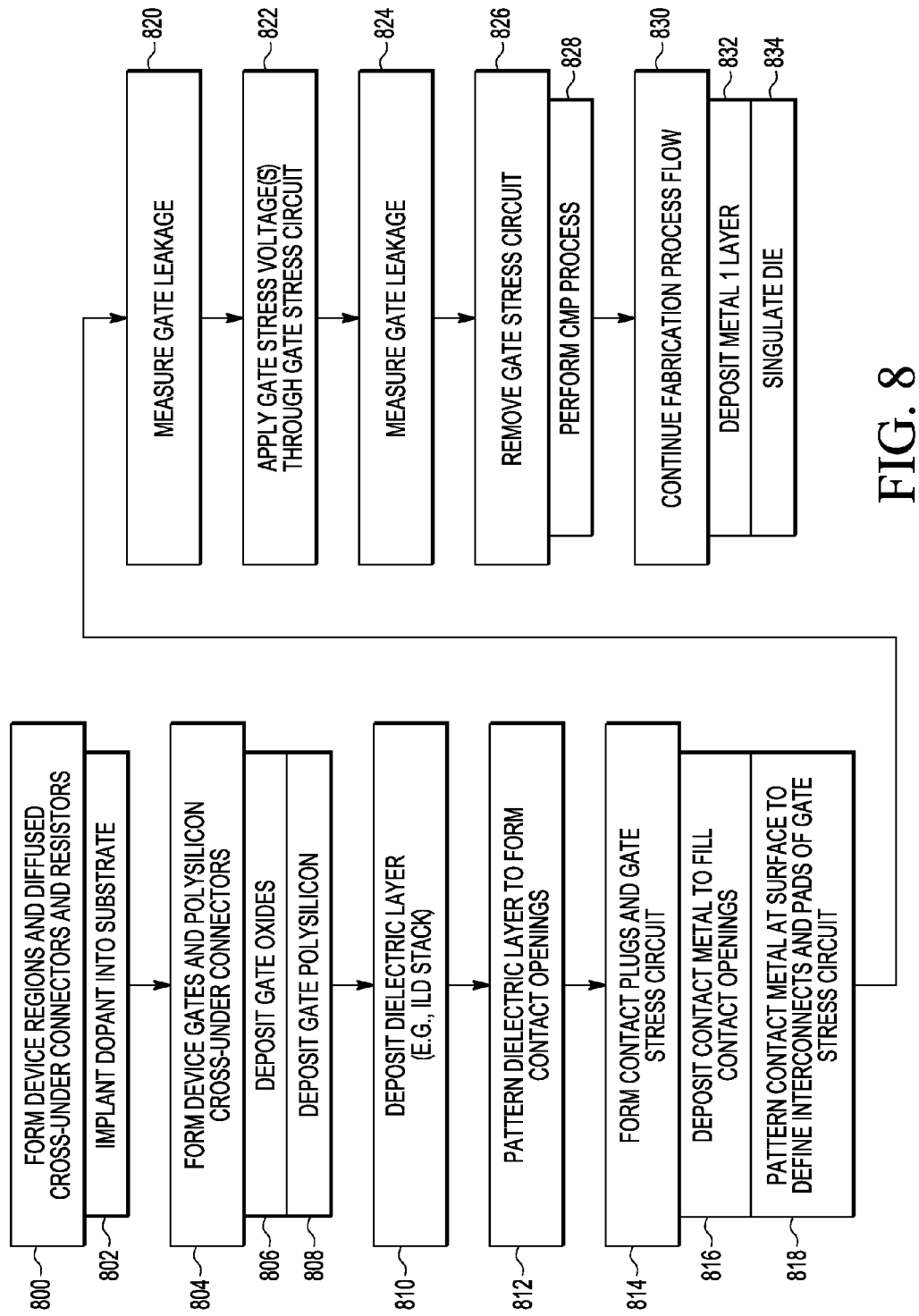
FIG. 8 is a flow diagram of an exemplary method of fabricating and testing a semiconductor device with a test circuit having a number of sacrificial interconnects in accordance with one embodiment.

FIG. 8 depicts a method of fabricating and testing a semiconductor device. The method includes a sequence of acts or steps, only the salient of which are depicted for convenience in illustration. Additional, fewer, or alternative acts or steps may be implemented. For example, a number of preliminary steps may be directed to preparing a substrate for subsequent processing. Any bulk or composite substrate may be used. Further steps may also be included in connection with assembly or other packaging procedures.

The method may begin with an act or block 800 in which device regions, such as a transistor body region, are formed in a semiconductor substrate. The device regions may be formed by doping the semiconductor substrate through, for instance, a dopant implantation procedure implemented in an act 802. Any dopant material may be used. One or more of the implantation or other doping procedures may be configured to define a cross-under connector or resistor of the test circuit in the substrate. The resistor may be used to electrically connect a respective interconnect of a test circuit to a corresponding device structure for isolation as described above. Other device regions, such as STI and/or DTI regions may also be formed at this time.

In an act 804, device gate structures are formed on the semiconductor substrate. In some embodiments, device gate structures of differing oxide thicknesses are formed. For example, the act 804 includes two sets of procedures to form gates with thin and thick oxide layers. In some embodiments, the act 804 includes the growth or other deposition of silicon dioxide layer(s) in an act 806 and the deposition of polysilicon in an act 808. Other insulating and conductive materials may be used for the gate structures. The acts 806 and 808 may also include the patterning of the oxide and polysilicon layers to define the gate structures.

The act 804 may also be used to form cross-under connectors and/or resistors of the test circuit supported by the semiconductor substrate. For example, the cross-under connectors may be defined by implementing the polysilicon deposition and patterning procedures used to form one of the gate structures.

Further device regions may be formed after the patterning of the gate structures. For example, source and drain regions may be formed through further dopant implantation procedures using the gate structures as a self-aligning mask.

A dielectric layer, such as an interlayer dielectric (ILD) stack is deposited in an act 810 over the semiconductor substrate. The deposition may occur once the formation of device regions and resistors in the substrate, and the formation of gate and other structures supported by the substrate, is complete. Any dielectric material(s) may be used. The dielectric layer is then patterned in an act 812 to define contact openings for the device regions, the device gate structures, and cross-under connectors.

In an act 814, a test circuit is formed over the semiconductor substrate. As described above, the test circuit includes sets or networks of sacrificial interconnects electrically connected to the gate and other device regions and structures. The test circuit may also include a number of sacrificial probe pads electrically connected to the interconnect networks. The act 814 may include depositing one or more conductive materials to form the interconnects. In some cases, the conductive material(s) are also used to form contact plugs in the contact openings in the dielectric layer. The contact plugs establish contacts to each device structure or cross-under connector as described above. In one example, a metal is sputtered or otherwise deposited in an act 816 in the contact openings to form the contact plugs, such as tungsten. Aluminum or other metals may be used to fill the contact openings in other embodiments. Because the metal is also deposited on the dielectric layer at that time, the metal may be patterned in an act 818 after the deposition to define the sacrificial interconnects on the dielectric layer. Other metals or conductive materials, such as aluminum, may be used for the sacrificial interconnects. In other embodiments, one material may be used for the contact plugs, while a different material is used for the interconnect networks and probe pads.

The patterning of the interconnect networks and probe pads may be customized for the gate stress testing of the transistor and other device structures of the semiconductor device. As described above, the sacrificial nature of the interconnects allows the test circuit to be configured to support gate stress testing of different gate oxide thicknesses, embedded transistors and other components that would be untestable once connected in a circuit arrangement. The test circuit may also be customized to achieve a desired level of testing. For example, the interconnects may extend across a die boundary of the semiconductor substrate to support reticle-level testing and wafer-level probing and testing. The test circuit may be configured for other levels of test granularity as described above.

The test circuit may also be configured with pads and interconnects to confirm the integrity of the testing. For example, the test circuit may include a first pad electrically connected to the gate structures by an interconnect network, which may include a serpentine interconnect as described above. The test circuit may then include a second pad electrically connected to the first pad by a return interconnect. The voltage at the second pad may be checked during testing to confirm that the serpentine or other interconnect(s) are free of faults that would prevent a stress or other voltage from reaching the gate structures.

A number of acts may then be implemented to conduct a gate oxide stress test or other leakage current test of the gate structures with the test circuit. In the embodiment of FIG. 8, gate leakage is measured in an act 820 to provide a baseline or reference level before the oxide layers are stressed in an act 822. During the act 820, one or more probe pads and corresponding interconnect networks may be used to apply a voltage (e.g., about 3 Volts for transistor devices having an oxide layer thickness of about 50 Å) to the gate structures. Other probe pads and corresponding interconnect networks may then be used to bias the substrate bulk and other device regions, as well as measure leakage current. The act 822 may include applying a first gate stress voltage (e.g., about 3.25 Volts) to one set of device structures (e.g., devices having an oxide layer thickness of about 50 Å), and applying a second, higher gate stress voltage (e.g., about 20 Volts) to another set of device structures (e.g., devices having an oxide layer thickness of about 300 Å). The gate stress voltages may vary for other devices having thin or thick oxide layers. Once the gate structures are stressed, the leakage current may then be measured in an act 824 again at the same voltage level(s) used in the act 822 to generate data for comparison with the reference or initial levels. In other embodiments, the leakage current data may be compared with a threshold level(s), in which case the initial gate leakage measurement may be skipped.

The interconnects and pads of the test circuit are removed in an act 826 after conducting the gate oxide stress test or other test. The act 826 may include conducting a wafer planarization procedure in an act 828, such as a CMP procedure. The planarization may be configured to remove the metal deposited on the dielectric layer, but not remove the contact plugs. The contact plugs may then be used in the circuit of the semiconductor device.

The test circuit may not be completely removed as a result of the acts 826, 828. For example, cross-under connectors and resistors at the polysilicon or substrate level, as well as the contact plugs leading thereto, are also leftover as artifacts of the test process. References to the removal of the test circuit include instances in which the test circuit is not completely removed, and such artifacts remain.

The fabrication of the semiconductor device may then continue in an act 830. The fabrication may proceed as if the acts related to the formation of the test circuit never occurred. A metallization procedure may be implemented, including, for instance, the deposition of a metal layer (e.g., a metal 1 layer) in an act 832. Any number of metal layers and further ILD layers may be deposited and patterned to define interconnects and other metal structures of the semiconductor device. Eventually, the substrate or wafer is diced in an act 834 in a die singulation procedure.

The order of the acts described above may vary. For example, one or more device regions, such as the regions of a device isolation ring or tub, may be formed after the deposition of polysilicon for the device gate structures and polysilicon cross-under connectors.

The embodiments described above are capable of wafer-level, zero defect screening. The test circuits may also be configured to provide any desired level of testing. The test circuits may be designed to test a limited number of transistor or other components, such as the components of one or more circuits, or one or more die, e.g., a group of die corresponding to a single reticle, or any other wafer subset. These and other testing levels may be pursued in the interest of satisfying fabrication cost or time constraints.

In one aspect, a method of testing a semiconductor device includes forming a test circuit over a semiconductor substrate, the test circuit including a plurality of interconnects electrically connected to a set of device structures supported by the semiconductor substrate, conducting a test of each device structure with the test circuit, and removing the plurality of interconnects after conducting the test.

In a second aspect, a method of fabricating a semiconductor device includes forming device regions in a semiconductor substrate, forming device gate structures on the semiconductor substrate, forming a test circuit over the semiconductor substrate, the test circuit including first and second sets of interconnects electrically connected to the device regions and the device gate structures, respectively, conducting a leakage current test with the test circuit, and removing the first and second sets of interconnects after conducting the leakage current test.

In a third aspect, a semiconductor wafer includes a semiconductor substrate in which device regions of a plurality of semiconductor devices are disposed, first and second sets of device gate structures of the plurality of semiconductor devices, the first and second sets of device gate structures being supported by the semiconductor substrate, and a test circuit supported by the semiconductor substrate. The test circuit includes a plurality of sacrificial interconnects electrically connected to the device regions and the first and second sets of device gate structures, a first probe pad electrically connected to the first set of device gate structures by a first network of the plurality of sacrificial interconnects, a second probe pad electrically connected to the second set of device gate structures by a second network of the plurality of sacrificial interconnects, and a third probe pad electrically connected to the device regions by a third network of the plurality of sacrificial interconnects.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of testing a semiconductor device, the method comprising:
   forming a test circuit over a semiconductor substrate, the test circuit comprising a plurality of interconnects electrically connected to a set of device structures supported by the semiconductor substrate;
   conducting a test of each device structure with the test circuit; and
   removing, through an etching or planarization procedure, the plurality of interconnects after conducting the test;
   wherein:
      the device structures comprise first and second gate structures;
      the first and second gate structures comprise first and second gate oxide layers, respectively;
      the first and second gate oxide layers have different thicknesses; and
      conducting the test comprises:
         applying a first stress voltage to the first gate structure via a first interconnect of the plurality of interconnects; and
         applying a second gate stress voltage to the second gate structure via a second interconnect of the plurality of interconnects.

2. The method of claim 1, wherein forming the test circuit comprises depositing a conductive material to form the plurality of interconnects, and wherein depositing the conductive material also forms contact plugs that establish a contact to each device structure.

3. The method of claim 2, wherein removing the plurality of interconnects does not remove the contact plugs.

4. The method of claim 1, wherein
   conducting a test comprises conducting a gate stress test or a leakage current test of the first gate oxide layer and the second gate oxide layer with the test circuit.

5. The method of claim 1, further comprising doping the semiconductor substrate to define a cross-under connector of the test circuit in the semiconductor substrate.

6. The method of claim 1, further comprising forming a polysilicon cross-under connector of the test circuit supported by the semiconductor substrate.

7. The method of claim 1, wherein one of the plurality of interconnects extends across a die boundary of the semiconductor substrate.

8. The method of claim 1, wherein the test circuit comprises:
   a first pad electrically connected to the set of device structures by the plurality of interconnects; and
   a second pad electrically connected to the first pad by a return interconnect of the plurality of interconnects.

9. The method of claim 1, further comprising forming a resistor of the test circuit in the semiconductor substrate, the resistor electrically connecting a respective interconnect of the plurality of interconnects to a corresponding device structure of the set of device structures.

10. The method of claim 1, wherein conducting the test comprises:
    applying a first voltage to the set of device structures; and
    applying a second voltage to a bulk of the semiconductor substrate.

11. A method of fabricating a semiconductor device, the method comprising:
    forming device regions in a semiconductor substrate;
    forming device gate structures on the semiconductor substrate;
    forming a test circuit over the semiconductor substrate, the test circuit comprising first and second sets of interconnects electrically connected to the device regions and the device gate structures, respectively;
    conducting a test with the test circuit; and
    removing, through an etching or planarization procedure, the first and second sets of interconnects after conducting the test;
    wherein:

forming the test circuit comprises depositing a conductive material to form the first and second sets of interconnects;

depositing the conductive material also forms contact plugs that establish a respective contact to each device region and each device gate structure;

removing the first and second sets of interconnects does not remove the contact plugs;

the device gate structures comprise first and second gate structures;

the first and second gate structures comprise first and second gate oxide layers, respectively;

the first and second gate oxide layers have different thicknesses; and conducting the test comprises:
applying a first stress voltage to the first gate structure via a first interconnect of the second set of interconnects; and
applying a second gate stress voltage to the second gate structure via a second interconnect of the second set of interconnects.

12. The method of claim 11, further comprising conducting metallization of the semiconductor device after removing the first and second sets of interconnects.

13. The method of claim 11, wherein removing the first and second sets of interconnects comprises implementing a wafer planarization process.

14. The method of claim 11, wherein forming the device regions comprises conducting an implantation of dopant into the semiconductor substrate, the dopant implantation being configured to define a cross-under connector of the test circuit.

15. The method of claim 11, wherein forming the device regions comprises conducting an implantation of dopant into the semiconductor substrate, the dopant implantation being configured to define a resistor of the test circuit.

16. A method of fabricating a semiconductor device, the method comprising:
forming device regions in a semiconductor substrate;
forming device gate structures on the semiconductor substrate;
depositing a dielectric layer over the semiconductor substrate;
patterning the dielectric layer to define contact openings for the device regions and the device gate structures;
forming a test circuit over the semiconductor substrate, the test circuit comprising first and second sets of interconnects electrically connected to the device regions and the device gate structures, respectively;
conducting a test with the test circuit; and
removing the first and second sets of interconnects after conducting the test;
wherein forming the test circuit comprises:
depositing metal in the contact openings to form contact plugs and on the dielectric layer to form the first and second sets of interconnects; and
patterning the metal on the dielectric layer to define the first and second sets of interconnects.

17. A semiconductor wafer comprising:
a semiconductor substrate in which device regions of a plurality of semiconductor devices are disposed;
first and second sets of device gate structures of the plurality of semiconductor devices, the first and second sets of device gate structures being supported by the semiconductor substrate; and
a test circuit supported by the semiconductor substrate and comprising:
a plurality of sacrificial interconnects electrically connected to the device regions and the first and second sets of device gate structures;
a first probe pad electrically connected to the first set of device gate structures by a first network of the plurality of sacrificial interconnects;
a second probe pad electrically connected to the second set of device gate structures by a second network of the plurality of sacrificial interconnects; and
a third probe pad electrically connected to the device regions by a third network of the plurality of sacrificial interconnects;
wherein:
each device gate structure of the first set of device gate structures comprises a respective first gate oxide layer;
each device gate structure of the second set of device gate structures comprises a respective second gate oxide layer;
the first and second gate oxide layers have different thicknesses.

18. The semiconductor wafer of claim 17, wherein:
the first network comprises a serpentine interconnect that electrically connects the first set of device gate structures to the first probe pad; and
the test circuit further comprises a fourth probe pad electrically connected to the first set of device gate structures by a return interconnect of the plurality of sacrificial interconnects.

19. The semiconductor wafer of claim 17, wherein one of the plurality of sacrificial interconnects extends across a die boundary.

* * * * *